(12) United States Patent
Kim

(10) Patent No.: US 7,807,559 B2
(45) Date of Patent: Oct. 5, 2010

(54) BONDING PAD FOR PREVENTING PAD PEELING AND METHOD FOR FABRICATING THE SAME

(75) Inventor: Jeong-Soo Kim, Ichon-shi (KR)

(73) Assignee: Hynix Semiconductor Inc., Icheon-si (KR)

( * ) Notice: Subject to any disclaimer, the term of this patent is extended or adjusted under 35 U.S.C. 154(b) by 205 days.

(21) Appl. No.: 12/165,216

(22) Filed: Jun. 30, 2008

(65) Prior Publication Data
US 2009/0014875 A1 Jan. 15, 2009

(30) Foreign Application Priority Data
Jul. 13, 2007 (KR) .............. 10-2007-0070557

(51) Int. Cl.
*H01L 21/60* (2006.01)
(52) U.S. Cl. ................... 438/612; 257/459
(58) Field of Classification Search ......... 257/459, 257/E23.02, 786; 438/612, 523, 533, 98
See application file for complete search history.

(56) References Cited
U.S. PATENT DOCUMENTS
2006/0043599 A1* 3/2006 Akram et al. ............ 257/774
2006/0063374 A1* 3/2006 Lin et al. .............. 438/622
2008/0237849 A1* 10/2008 Pratt .................. 257/737
2009/0152727 A1* 6/2009 Kim ................... 257/753
2009/0267194 A1* 10/2009 Chen .................. 257/621

FOREIGN PATENT DOCUMENTS
| JP | 2003-282573 | 10/2003 |
| JP | 2007-012646 | 1/2007 |
| KR | 1020000018729 A | 4/2000 |
| KR | 1020010062344 A | 7/2001 |

* cited by examiner

*Primary Examiner*—Thao P. Le
(74) *Attorney, Agent, or Firm*—Townsend and Townsend and Crew LLP

(57) ABSTRACT

A bonding pad includes multiple metal layers, insulation layers filled between the multiple metal layers, and a fixing pin coupled between the uppermost metal layer, where a bonding is performed, and the underlying metal layers. Peeling of the bonding pad can be prevented during the ball bonding by forming the fixing pin coupled to the edges of the bonding pad. The upper portion of the fixing pin is formed in a disk shape and a ball portion of the fixing pin is fixed by slits such that the peeling of the bonding pad can be further prevented.

7 Claims, 11 Drawing Sheets

US 7,807,559 B2

BONDING PAD FOR PREVENTING PAD PEELING AND METHOD FOR FABRICATING THE SAME

CROSS-REFERENCE TO RELATED APPLICATIONS

The present invention claims priority of Korean patent application number 10-2007-0070557, filed on Jul. 13, 2007, which is incorporated by reference in its entirety.

BACKGROUND OF THE INVENTION

The present invention relates to a semiconductor device, and more particularly, to a bonding pad for preventing a pad from peeling in a ball bonding, and a method for fabricating the same.

In the fabrication of a semiconductor device, wire bonding in a packaging process is an electrical interconnection technique. In the wire bonding, a metal pad of a bonding pad part provided in a chip is electrically interconnected to a lead frame for connection to an external device. For example, in the wire bonding, a ball bonding is performed over a metal pad. The bonding pad part to be bonded includes multiple metal layers and insulation layers filling gaps between the multiple metal layers.

FIG. 1 illustrates a cross-sectional view of a typical bonding pad structure, and FIG. 2 illustrates a cross-sectional view for explaining a technical limitation of a typical ball bonding.

Referring to FIG. 1, the typical bonding pad includes a first metal layer M1, a second metal layer M2, and a third metal layer M3. A first insulation layer IMD1 is formed between the first metal layer M1 and the second metal layer M3, and a second insulation layer IMD2 is formed between the second metal layer M2 and the third metal layer M3. A ball bonding is performed on the uppermost layer, that is, the third metal layer M3.

In a subsequent package fabrication process, as illustrated in FIG. 2, a ball bonding 11 is performed on a center of the third metal layer M3 in the bonding pad of FIG. 1.

However, pressure generated by the ball bonding 11 is transferred to the second insulation layer IMD2 and the second metal layer M2, and a repulsive force 12 is transferred to edges of the third metal M3. The repulsive force 12 causes a pad peeling 13 at the edges of the third metal layer M3, leading to a ball bonding failure. That is, a peeling phenomenon occurs so that an attachment force of the pad is weakened and the pad is peeled off.

SUMMARY OF THE INVENTION

Embodiments of the present invention are directed to providing a bonding pad, which is capable of preventing a pad failure of a bonding pad during a bonding process, and a method for fabricating the same.

In accordance with an aspect of the present invention, a bonding pad is provided. The bonding pad includes multiple metal layers, insulation layers filled between the multiple metal layers, and a fixing pin coupled between the uppermost metal layer, where a bonding is performed, and the underlying metal layers.

In accordance with another aspect of the present invention, a method for fabricating a bonding pad is provided. The method includes forming a first insulation layer, forming a plurality of slits over the first insulation layers, forming a second insulation layer over the slits, partially etching the second insulation layer and the first insulation layer to form a contact hole penetrating an interval between the slits, forming a fixing pin filling the contact hole, and forming a metal layer coupled to the fixing pin and at which a bonding is to be performed.

DESCRIPTION OF SPECIFIC EMBODIMENTS

Hereinafter, a bonding pad and a method for fabricating the same in accordance with the present invention will be described in detail with reference to the accompanying drawings.

The present invention relates to a technique that can prevent a pad of a bonding pad from peeling. The peeling is caused by pressure generated during a ball bonding. The technique may be applied to a pad forming process of a memory device where a ball bonding is performed on a bonding pad part for a package. In addition, the present invention relates to a technique that can prevent any pad from peeling, which may be caused in a process of forming a large pattern having the same shape as a bonding pad.

A technical principle applied to the following embodiments is to form a fixing pin for fixing a bonding pad to an outer empty area of a ball bonding region in a bonding pad forming process in order to prevent the pad from peeling. In addition, an upper portion of the fixing pin is formed in a shape of a wine glass to increase an attachment force with respect to the uppermost metal layer, and a lower portion of the fixing pin is formed in a shape of a ball to fix it to a metal layer formed under the uppermost metal layer, thereby preventing the fixing pin from being removed. In this way, the pad may be further prevented from peeling.

Figure 1:
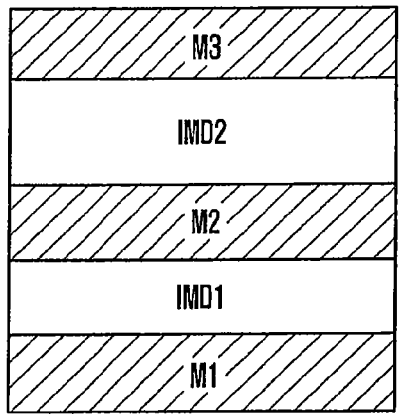
FIG. 1 illustrates a cross-sectional view of a typical bonding pad structure.
Figure 2:
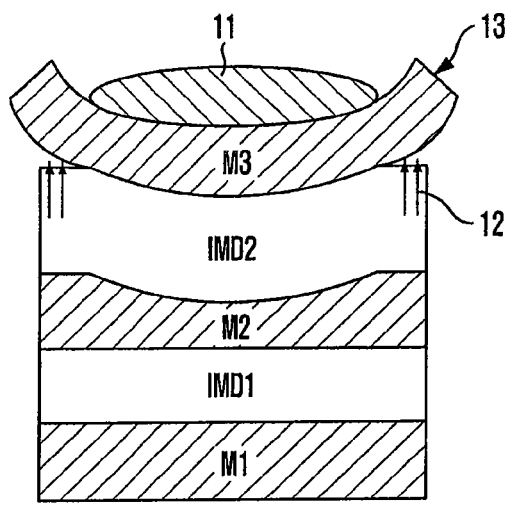
FIG. 2 illustrates a cross-sectional view for explaining a technical limitation of a typical ball bonding.
Figure 3:
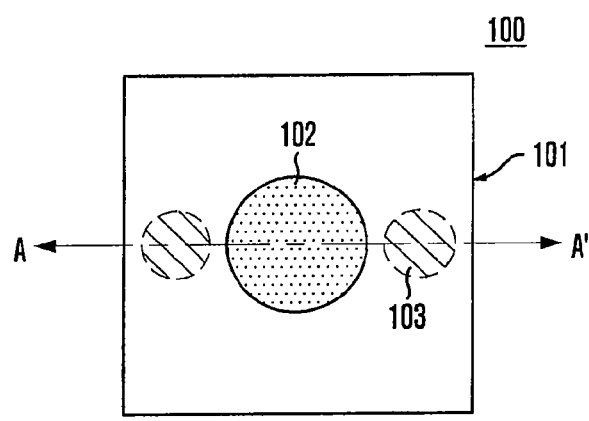
FIG. 3 illustrates a plan view of a bonding pad in accordance with an embodiment of the present invention.
Figure 4A:
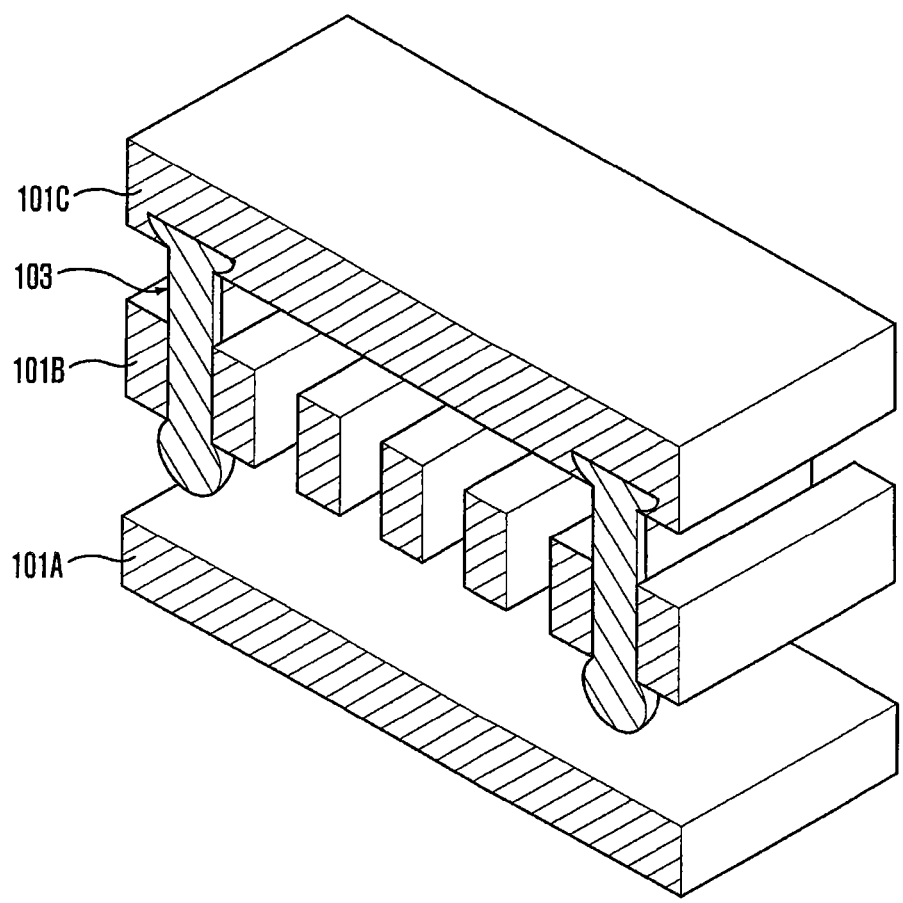
FIG. 4A illustrates a perspective cross-sectional view taken along line A-A' of FIG. 3.

FIG. 3 illustrates a plan view of a bonding pad in accordance with an embodiment of the present invention. FIG. 4A illustrates a perspective cross-sectional view taken along line A-A' of FIG. 3, and FIG. 4B illustrates a perspective view of a fixing pin in FIG. 4A.

Referring to FIG. 3, a bonding pad 100 includes multiple metal layers 101 and insulation layers (not shown) filled between the multiple layers 101. A fixing pin 103 is coupled between the uppermost metal layer and the underlying metal layers at an outer area beyond the bonding region 102.

It is assumed that the multiple metal layers 101 include a first metal layer, a second metal layer, and a third metal layer. The connection structure of the respective metal layers is well-known and is omitted for convenience of description.

Figure 4B:
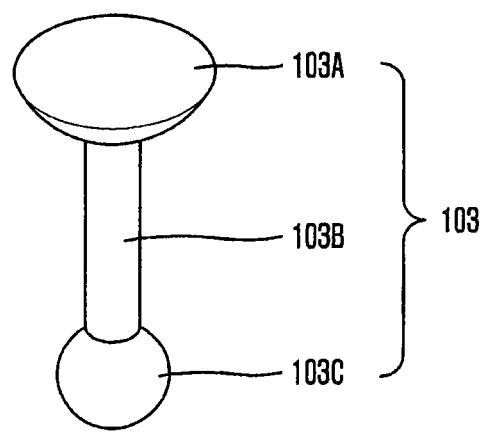
FIG. 4B illustrates a perspective view of a fixing pin in FIG. 4A.

Referring to FIGS. 4A and 4B, the bonding pad 100 includes a first metal layer 101A, a plurality of lateral slits 101B formed of a second metal layer, and a third metal layer 101C. Unlike the second metal layer 101B, the first metal layer 101A and the third metal layer 101C are formed in a plate shape.

A fixing pin 103 is coupled between the third metal layer 101C and the slits 101B. That is, an upper portion of the fixing pin 103 is inserted into and fixed to a lower portion of the third metal layer 101C, and a lower portion of the fixing pin 103 is positioned between and is fixed under two adjacent slits 101B.

As illustrated in FIG. 4B, the fixing pin 103 includes a disk portion 103A, a pillar portion 103B, and a ball portion 103C. The disk portion 103A of the fixing pin 103 is inserted into and fixed to a lower portion of the third metal layer 101C, and the pillar portion 103B of the fixing pin 103 is cylindrical and passes through a gap between the slits 101B. The ball portion 103C of the fixing pin 103 is formed under the gap between the adjacent slits 101B. Since the disk portion 103A has a rounded lower portion and is coupled to the pillar portion 103B, the fixing pin 103 is formed in a shape of a wine glass. The ball portion 103C of the fixing pin 103 has a diameter greater than a size of the gap between the slits 101B. It can be said that the disk portion 103A of the fixing pin 103 has a shape of a screw head.

In such a bonding pad 100, the fixing pin 103 can prevent the peeling of the uppermost metal layer, i.e., the third metal layer 101C, during the bonding process. In addition, the attachment force between the fixing pin 103 and the third metal layer 101C is further increased because the disk portion 103A of the fixing pin 103 is rounded at the lower portion. Also, since the ball portion 103C of the fixing pin 103 has a diameter greater than the size of the gap between the slits 101B, the third metal layer 101C coupled to the fixing pin 103 is not removed. Since the fixing pin 103 is formed at the outer area of the bonding region, not below the bonding region, the pad peeling caused by the repulsive force at the edges of the third metal layer 101C can be further prevented.

FIGS. 5A to 5H illustrate cross-sectional views of a method for fabricating a bonding pad in accordance with a first embodiment of the present invention.

Figure 5A:
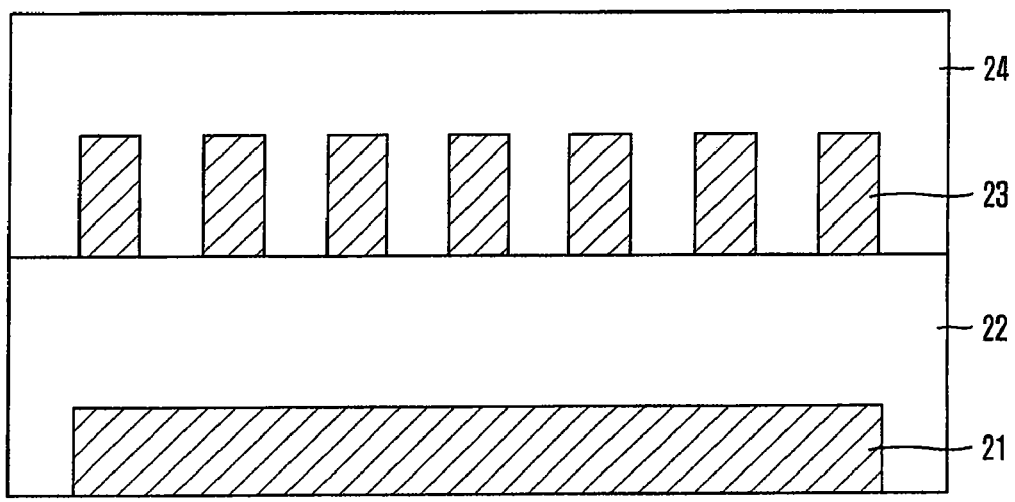
FIGS. 5A to 5H illustrate cross-sectional views of a method for fabricating a bonding pad in accordance with a first embodiment of the present invention.

Referring to FIG. 5A, a first metal layer 21 is formed and a first insulation layer 22 is formed over the first metal layer 21. The first metal layer 21 may include an aluminum layer or a copper layer, and the first insulation layer 22 may include an intermetal dielectric (IMD), for example, an oxide layer. The first insulation layer 22 is formed of a low-k dielectric, which can reduce a parasitic capacitance between the first metal layer 21 and slits, which will be formed later.

A plurality of slits 23 formed of the second metal layer is formed over the first insulation layer 22. The plurality of slits 23 are formed by forming the second metal layer and patterning the formed second metal layer so that the patterns are arranged in a slit shape. The plurality of slits 23 has the same size and is arranged with the same spacing. The slits 23 may include an aluminum layer or a copper layer.

A second insulation layer 24 is formed over the slits 23. The second insulation layer 24 is formed to fill the gaps between the slits 23. The second insulation layer 24 may include an intermetal dielectric (IMD), for example, an oxide layer. The second insulation layer 24 is formed of a low-k dielectric, which can reduce a parasitic capacitance between the slits 23 and a third metal layer, which will be formed later.

Figure 5B:
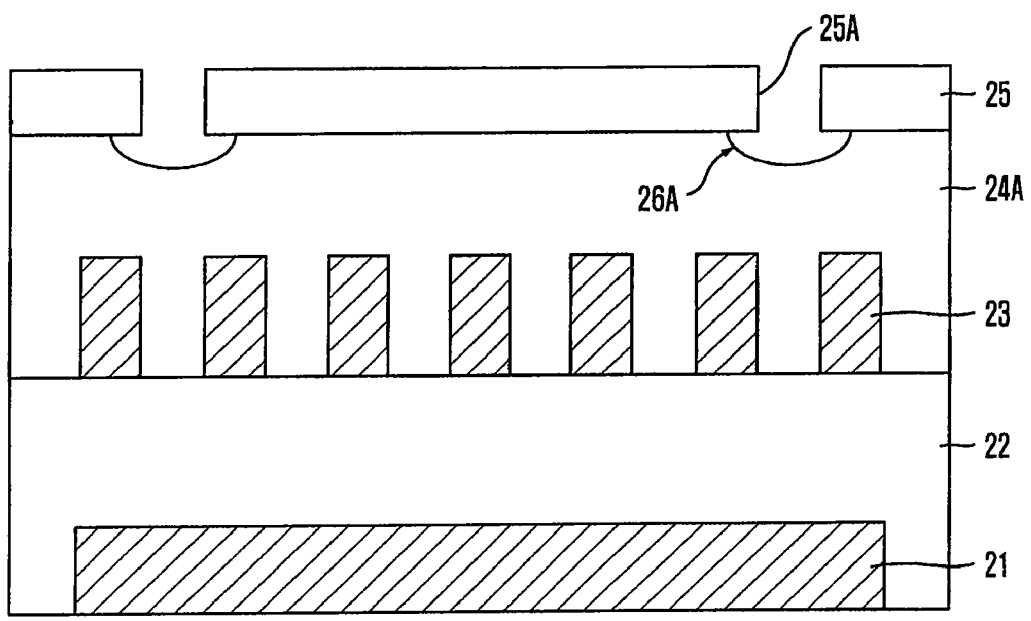

Referring to FIG. 5B, a contact mask 25 is formed over the second insulation layer 24 using a photoresist layer. The contact mask 25 has an opening 25A formed with a predetermined size. The opening 25A defines a contact hole at an outer area of the bonding region.

A portion of the second insulation layer 24 is etched using the contact mask 25 to form a first contact hole 26A. A diameter of the first contact hole 26A is larger than a diameter of the opening 25A. To this end, a portion of the second insulation layer 24 is etched using a wet etch process. The etched second insulation layer will be referred to as a primarily-etched second insulation layer 24A.

Figure 5C:
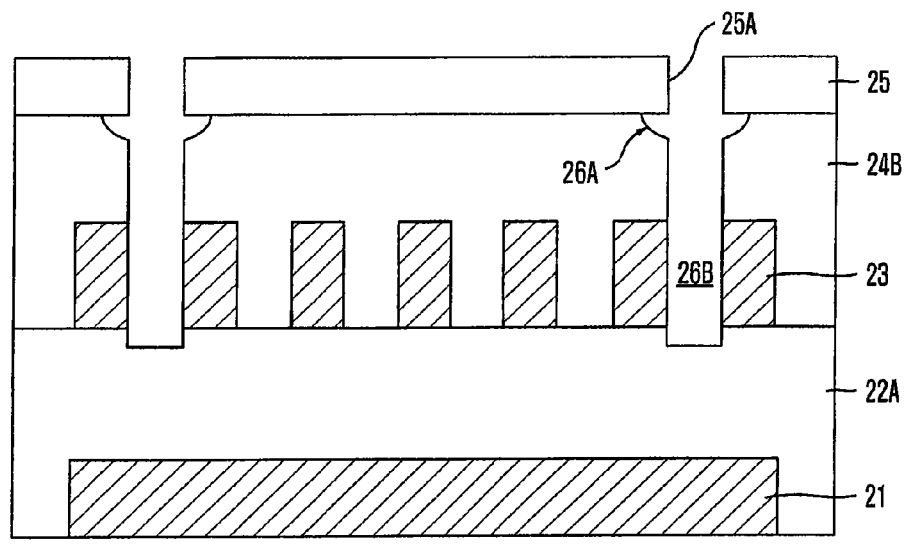

Referring to FIG. 5C, the primarily-etched second insulation layer 24A under the first contact hole 26A is further etched to form a second contact hole 26B having a vertical profile. In order to form the second contact hole 26B, a dry etch process is performed using the contact mask 25 as an etch barrier.

The second contact hole 26B has a width smaller than the first contact hole 26A and a depth greater than the first contact hole 26A. Accordingly, the first contact hole 26A and the second contact hole 26B are vertically connected to form a shape of a wine glass.

During the dry etch process for forming the second contact hole 26B, the primarily-etched second insulation layer 24A formed between the slits 23 and self-aligned by the slits 23 is further etched so that the second contact hole 26B is formed in the gap between the slits 23. A portion of the first insulation layer 22 under the slits 23 may be etched to further extend the depth of the second contact hole 26B. The second insulation layer 24 and the first insulation layer 22 etched during the dry etch process for forming the second contact hole 26B will be referred to as a secondarily-etched second insulation layer 24B and a primarily-etched first insulation layer 22A, respectively.

Figure 5D:
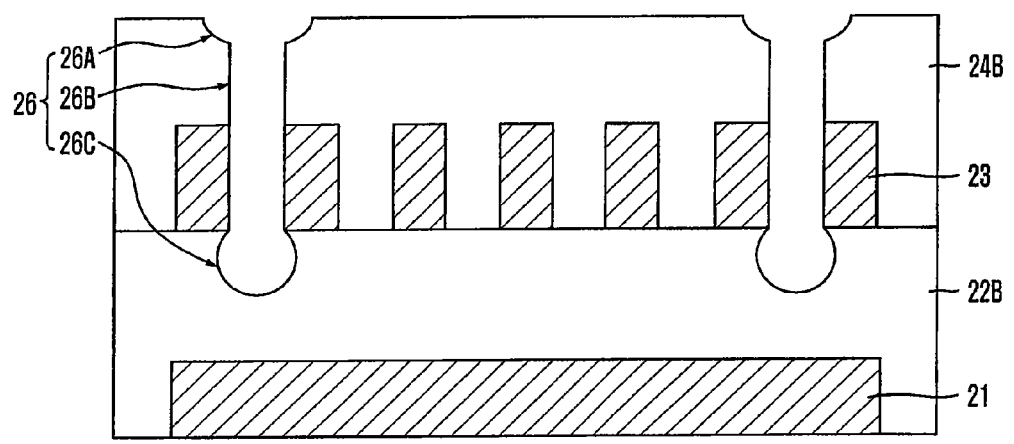

Referring to FIG. 5D, the primarily-etched first insulation layer 22A formed under the second contact hole 26B is isotropically etched to from a third contact hole 26C. The third contact hole 26C formed by the isotropic etch process has a ball shape. A diameter of the third contact hole 26C is greater than the size of the gap between the slits 23.

The photoresist layer used as the contact mask 25 is removed by a stripping process.

The contact hole 26 resulting from the removal of the contact mask 25 includes the first contact hole 26A, the second contact hole 26B, and the third contact hole 26C. Due to the first contact hole 26A, the upper portion of the contact hole 26 has a shape of a wine glass, and the diameter of the third contact hole 26C is greater than the size of the gap between the slits 23. Reference numeral 22B refers to a secondarily-etched first insulation layer etched during the process of forming the third contact hole 26C.

Figure 5E:
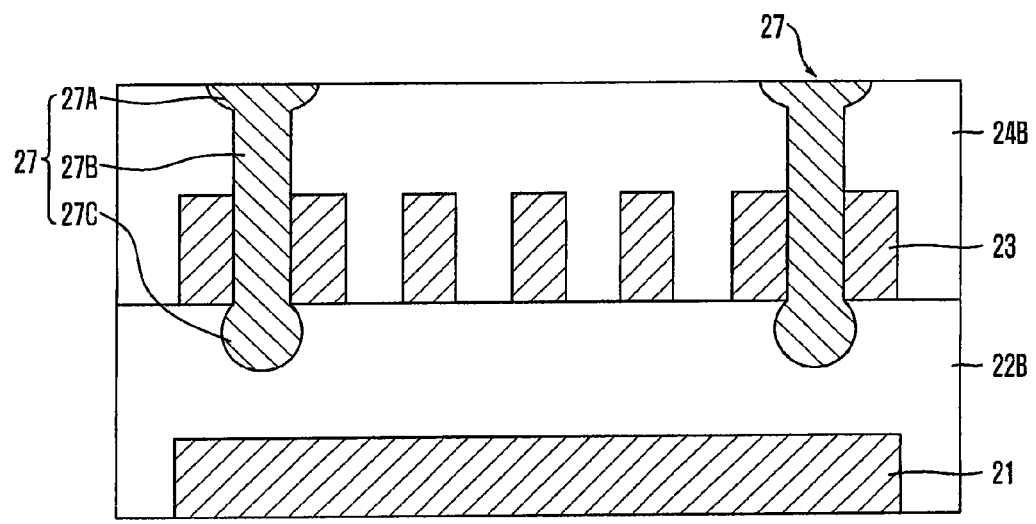

Referring to FIG. 5E, a fixing pin 27 is formed to fill the contact hole 26. The fixing pin 27 is a plug that is formed by forming a tungsten layer and performing an etch-back process on the formed tungsten layer.

Since the pattern of the contact hole (26 in FIG. 5D) is transferred, the fixing pin 27 has a structure in which a disk portion 27A, a pillar portion 27B, and a ball portion 27C are connected together.

The fixing pin 27 functions to prevent the peeling of the pad during a subsequent ball bonding, which will be described later.

Figure 5F:
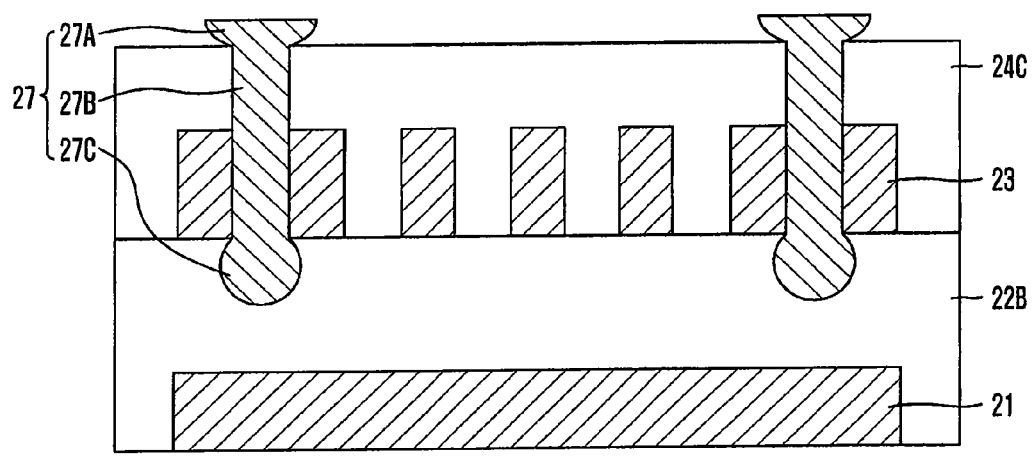

Referring to FIG. 5F, the secondarily-etched second insulation layer 24B is recessed by a wet etch process. The wet etch process is performed until the disk portion 27A of the fixing pin 27 is exposed. For example, the wet etch process is performed using fluoric acid (HF) or a solution containing fluoric acid (HF). Due to a thirdly-etched second insulation layer 24C being recessed by the wet etch process, the disk portion 27A of the fixing pin 27 is exposed.

Figure 5G:
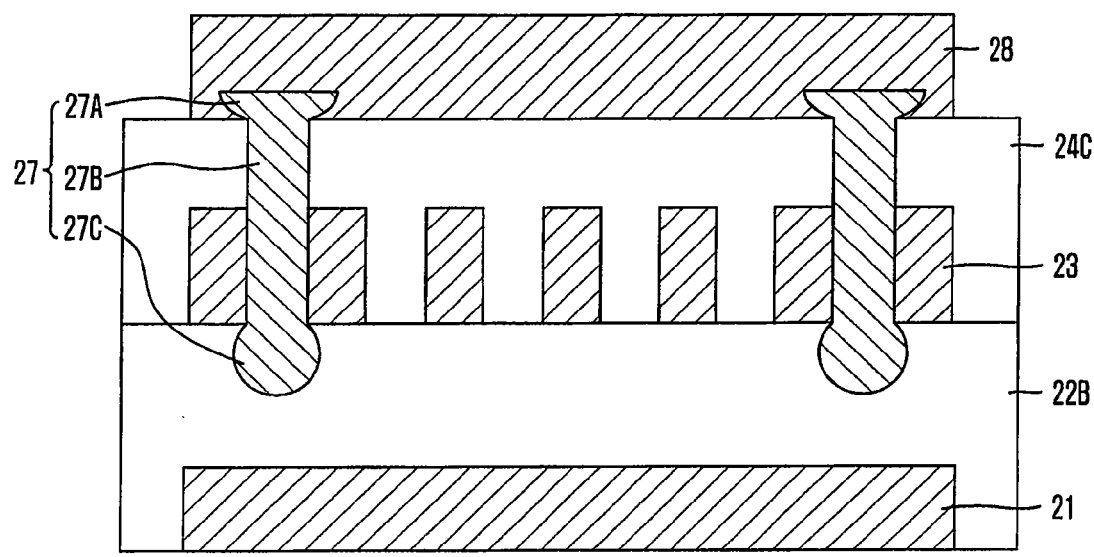

Referring to FIG. 5G, a third metal layer 28 is formed over the thirdly-etched second insulation layer 24C and is then etched. Accordingly, the bottom surface of the third metal layer 28 is coupled to the fixing pin 27. Meanwhile, during the formation of the third metal layer 28, surface unevenness may occur due to the fixing pin 27, causing a bonding failure. The third metal layer 28 is planarized by a chemical mechanical polishing (CMP) process or the like. It should be noted that the planarization process is carefully performed not to expose the upper portion of the fixing pin 27.

Figure 5H:
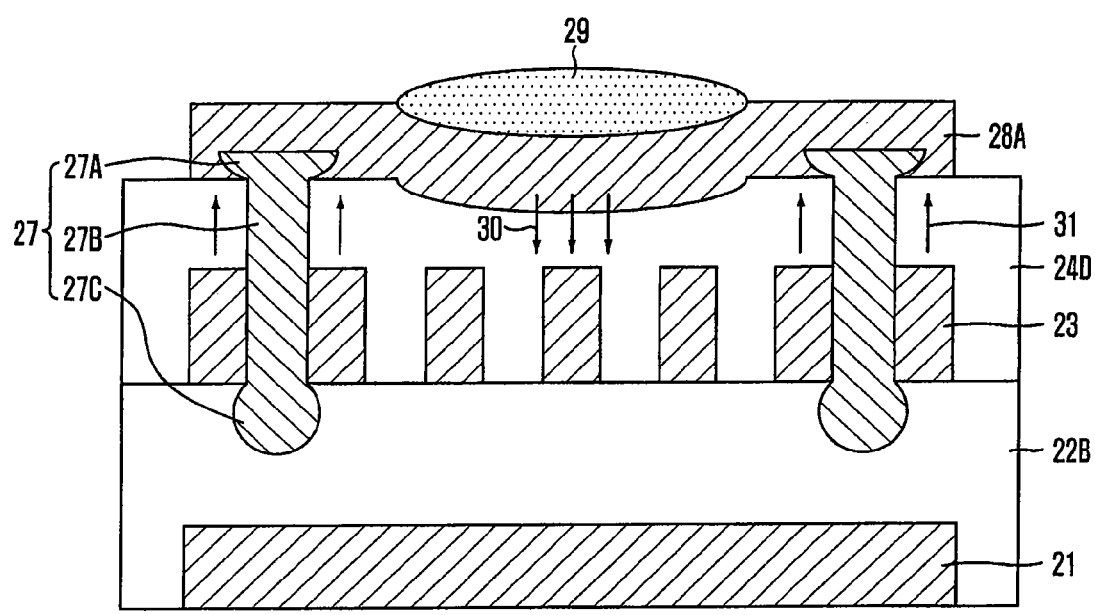

Referring to FIG. 5H, a ball bonding 29 is performed on the third metal layer 28.

Pressure 30 generated by the ball bonding 29 is transferred to the thirdly etched second insulation layer 24C and the slits 23, and a repulsive force 31 is transferred to edges of the third metal layer 28.

Even though the repulsive force 31 is transferred to the edges of the third metal layer 28, pad peeling is prevented because the edges of the third metal layer 28 are fixed by the fixing pins 27. That is, when the repulsive force 31 is transferred to the edges of the third metal layer 28, the attachment force between the fixing pins 27 and the edges of the third metal layer 28 is increased because the disk portion 27A of the fixing pin 27 has a shape of a wine glass, thereby preventing the pad from peeling. Furthermore, since the ball portion 27C of the fixing pin 27 has a diameter greater than the size of the gap between the slits 23, the fixing pins 27 are not removed and thus the peeling of the third metal layer 28 is further prevented. Reference numerals 24D and 28A respectively refer to a recessed second insulation layer and a transformed third metal layer deformed by the pressure generated by the ball bonding 29.

Figure 6A:
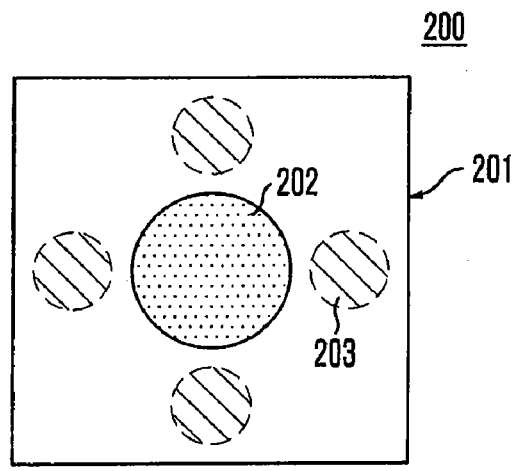
FIG. 6A illustrates a plan view of a bonding pad in accordance with a second embodiment of the present invention.

FIG. 6A illustrates a plan view of a bonding pad in accordance with a second embodiment of the present invention. Fixing pins 203 are formed at upper and lower sides of the bonding region 202, as well as at right and left sides of the bonding region 202.

The bonding pad 200 in accordance with the second embodiment of the present invention includes multiple metal layers 201 and insulation layers (not shown) filled between the multiple layers 201. The fixing pins 203 are coupled between the uppermost metal layer and the underlying metal layers at an outer area outside of a bonding region 202. Although not illustrated, like the first embodiment of the present invention, the multiple metal layers include a first metal layer, a plurality of slits formed of a second metal layer, and a third metal layer. The fixing pins 203 are coupled between the third metal layer and the slits.

Figure 6B:
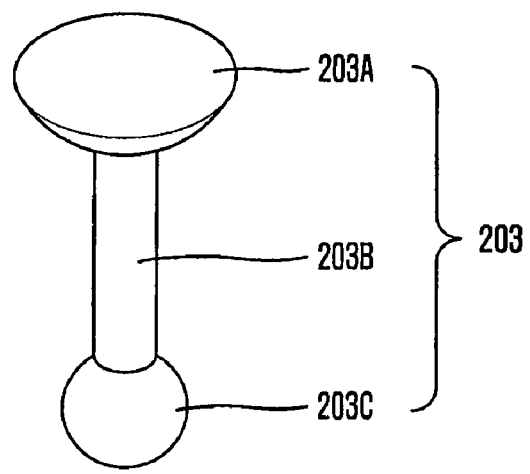
FIG. 6B illustrates a perspective view of a fixing pin in accordance with the second embodiment of the present invention.

FIG. 6B illustrates a perspective view of the fixing pin in accordance with the second embodiment of the present invention. The fixing pin 203 includes a disk portion 203A, a pillar portion 203B, and a ball portion 203C.

Like the first embodiment of the present invention, the bonding pad 200 in accordance with the second embodiment of the present invention can prevent the pad from peeling. In particular, the second embodiment can further increase the peeling prevention effect compared with the first embodiment because four fixing pins are provided at the outer area of the bonding region.

Figure 6C:
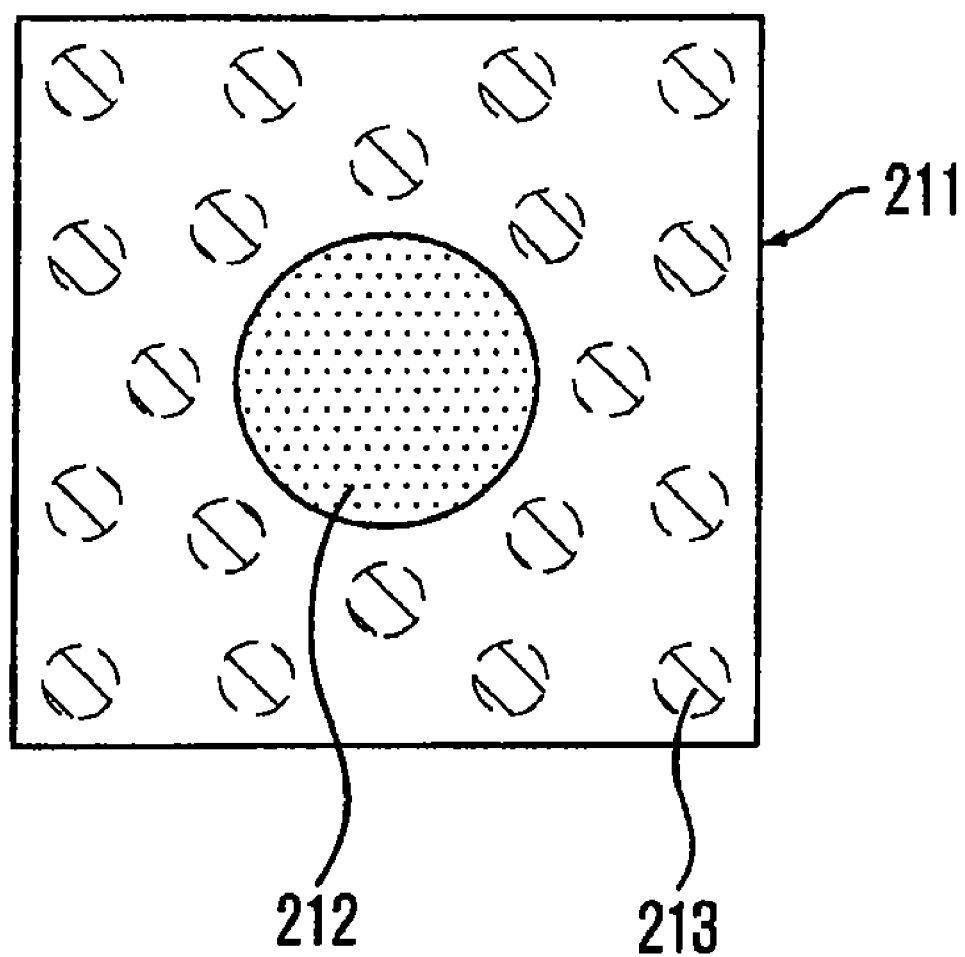
FIG. 6C illustrates a plan view of a bonding pad in accordance with a third embodiment of the present invention.

FIG. 6C illustrates a plan view of a bonding pad in accordance with a third embodiment of the present invention. A plurality of fixing pins 213 is formed at an outer area of a bonding region 212.

The bonding pad 210 in accordance with the third embodiment of the present invention includes multiple metal layers 211 and insulation layers (not shown) filled between the multiple layers 211. At least four fixing pins 213 are coupled between the uppermost metal layer and the underlying metal layers at an outer area outside of a bonding region 212. Although not illustrated, like the first embodiment of the present invention, the multiple metal layers include a first metal layer, a plurality of slits formed of a second metal layer, and a third metal layer. The fixing pins 213 are coupled between the third metal layer and the slits.

Like the first embodiment of the present invention, the bonding pad 210 in accordance with the third embodiment of the present invention can prevent the pad from peeling. In particular, the third embodiment can further increase the peeling prevention effect compared with the first and second embodiments because the plurality of fixing pins is provided at the outer area of the bonding region 212.

Figure 7A:
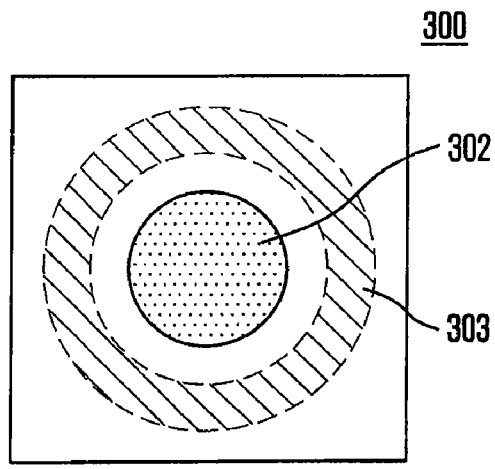
FIG. 7A illustrates a plan view of a bonding pad in accordance with a fourth embodiment of the present invention.

FIG. 7A illustrates a plan view of a bonding pad in accordance with a fourth embodiment of the present invention. A fixing pin 303 has a circular ring shape to enclose an outer area of a bonding region 302.

Figure 7B:
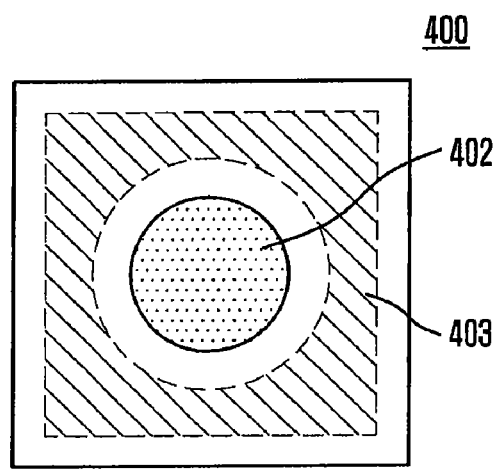
FIG. 7B illustrates a plan view of a bonding pad in accordance with a fifth embodiment of the present invention.

FIG. 7B illustrates a plan view of a bonding pad in accordance with a fifth embodiment of the present invention. A fixing pin 403 has a polygonal ring shape to enclose an outer area of a bonding region 402.

Figure 8A:
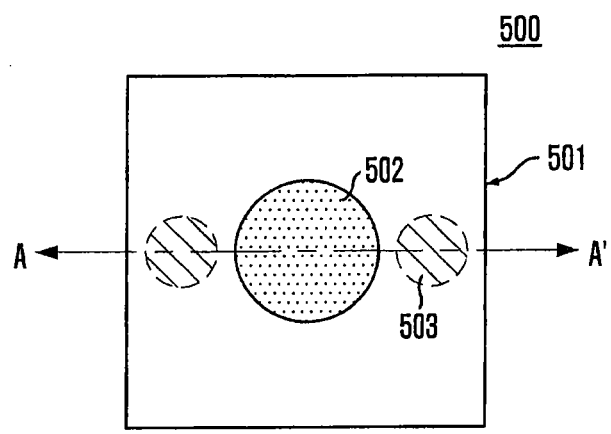
FIG. 8A illustrates a plan view of a bonding pad in accordance with a sixth embodiment of the present invention.
Figure 8B:
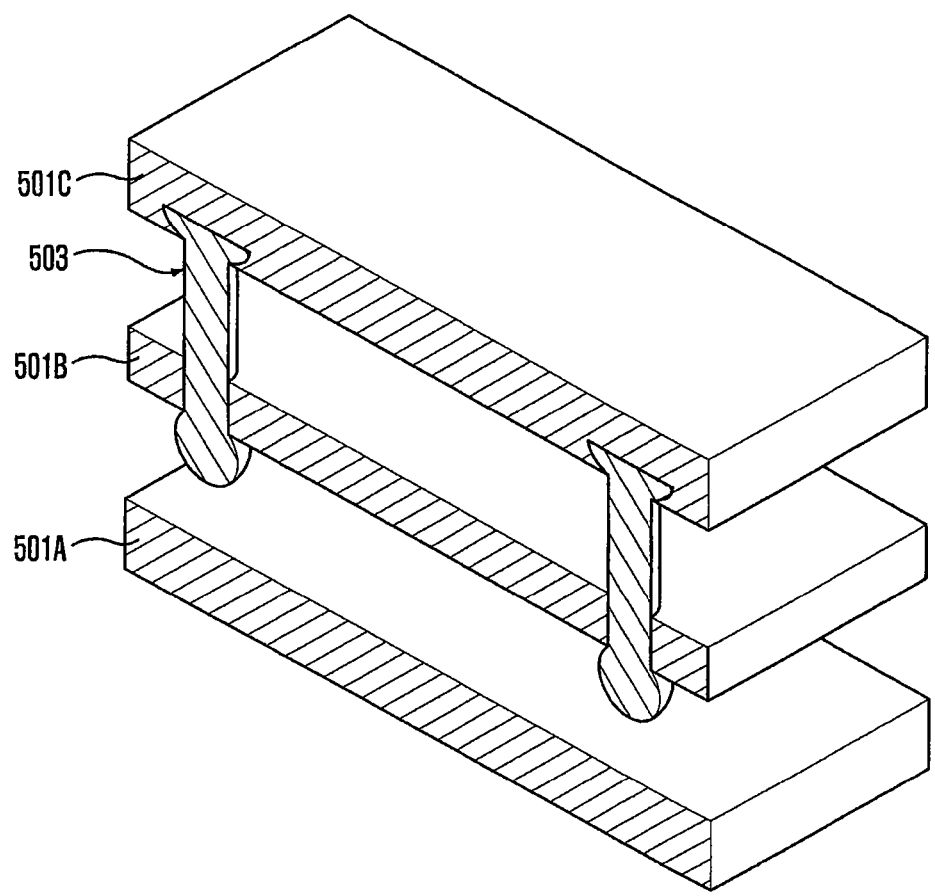
FIG. 8B illustrates a perspective cross-sectional view taken along line A-A' of FIG. 8A.
Figure 8C:
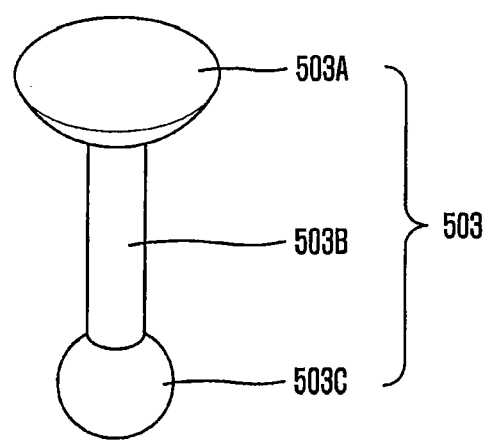
FIGS. 8C and 8D illustrate perspective views of a fixing pin and a second metal layer in accordance with the sixth embodiment of the present invention.
Figure 8D:
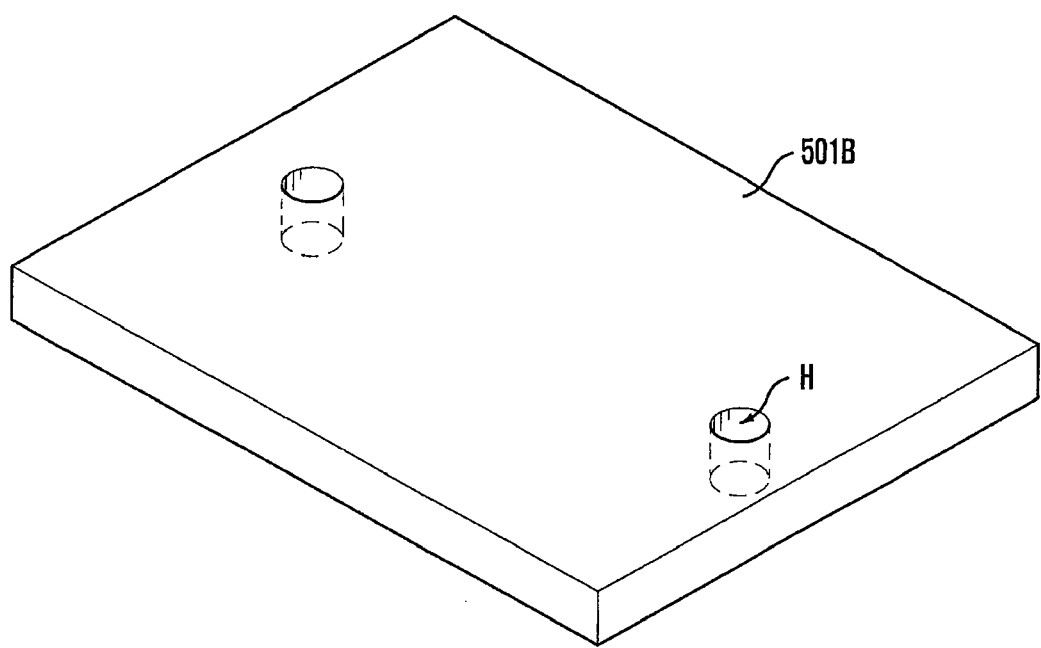

FIG. 8A illustrates a plan view of a bonding pad in accordance with a sixth embodiment of the present invention. FIG. 8B illustrates a perspective cross-sectional view taken along line A-A' of FIG. 8A. FIG. 8C illustrates a perspective view of a fixing pin in FIG. 8A. FIG. 8D illustrates a perspective view of a second metal layer in accordance with the sixth embodiment of the present invention.

Referring to FIG. 8A, a bonding pad 500 includes multiple metal layers 501 and insulation layers (not shown) filled between the multiple metal layers 501. A fixing pin 503 is coupled between the uppermost metal layer and the underlying metal layers at an outer area beyond the bonding region 502.

The multiple metal layers 501 include a first metal layer, a second metal layer, and a third metal layer.

Referring to FIGS. 8B and 8C, the bonding pad 500 includes the first metal layer 501A, the second metal layer 501B, and the third metal layer 501C. The first metal layer 501A, the second metal layer 501B, and the third metal layer 503C are formed in a plate shape. While the second metal layer in accordance with the first embodiment of the present invention is formed in a slit shape, the second metal layer 501B in accordance with the sixth embodiment of the present invention is formed in a plate shape. In order to form the fixing pin 503 passing through the second metal layer 501B, the second metal layer 501B is patterned to form a hole (H in FIG. 8D) that is large enough to allow the pillar portion of the fixing pin 503 to pass through, and a subsequent process of forming a contact hole is then performed. In another method, the second metal layer 501B may be etched during the process of forming the contact hole. However, such a method may cause the deformation of the contact hole that has been previously formed during the etching of the second metal layer 501B. Therefore, it is preferable that the second metal layer 501B is previously patterned to form the hole H.

The fixing pin 503 is coupled between the third metal layer 501C and the second metal layer 501B. Specifically, the upper portion of the fixing pin 503 is inserted into and fixed to the lower portion of the third metal layer 501C, and the lower portion of the fixing pin 503 passes through the second metal layer 501B and is fixed to the bottom surface of the second metal layer 501B.

Referring to FIG. 8C, the fixing pin 503 includes a disk portion 503A, a pillar portion 503B, and a ball portion 503C. The disk portion 503A of the fixing pin 503 is inserted into and fixed to the lower portion of the third metal layer 501C, and the pillar portion 503B of the fixing pin 503 is formed in a cylindrical shape and passes through the second metal layer 501B. The ball portion 503C of the fixing pin 503 is coupled to the pillar portion 503B passing through the second metal layer 501B.

Since the disk portion 503A has a rounded lower portion and is coupled to the pillar portion 503B, the fixing pin 503 is formed in a shape of a wine glass. The ball portion 503C has a diameter greater than the pillar portion 503B passing through the second metal layer 501B. Accordingly, it is possible to prevent the fixing pin 503 from being removed. It can be said that the disk portion 503A has a shape of a screw head.

In the bonding pad 500 in accordance with the sixth embodiment of the present invention, the fixing pin 503 can prevent the uppermost metal layer, i.e., the third metal layer 501C, from being peeled during the bonding process.

Furthermore, since the disk portion 503A of the fixing pin 503 has the rounded lower portion, the attachment force between the fixing pin 503 and the third metal layer 501C is further increased. Since the diameter of the ball portion 503C is large enough to prevent the second metal layer 501B from being removed, the third metal layer 501C coupled to the fixing pin 503 is not removed.

In accordance with the above-described embodiments of the present invention, the attachment force (that is, a mechanical strength) of the bonding pad is increased due to the fixing pin coupled to the edges of the bonding pad where the ball bonding is performed, thereby preventing the pad from peeling.

Moreover, since the fixing pin has the disk portion and the ball portion, the attachment force between the fixing pin and the bonding pad can be further increased.

As described above, the peeling of the bonding pad can be prevented during the ball bonding by forming the fixing pin coupled to the edges of the bonding pad.

Furthermore, since the upper portion of the fixing pin is formed in a disk shape and the ball portion of the fixing pin is fixed by the slits, the peeling of the bonding pad can be further prevented.

Consequently, since the peeling of the bond pad is prevented, the yield of the package can be improved and the fabrication cost can be reduced.

While the present invention has been described with respect to the specific embodiments, the above embodiments of the present invention are illustrative and not limitative. It will be apparent to those skilled in the art that various changes and modifications may be made without departing from the spirit and scope of the invention as defined in the following claims.

What is claimed is:

1. A method for fabricating a bonding pad, the method comprising:
   forming a first insulation layer;
   forming a plurality of slits over the first insulation layer;
   forming a second insulation layer over the slits;
   partially etching the second insulation layer and the first insulation layer to form a contact hole defined in an interval between the slits;
   forming a fixing pin filling the contact hole; and
   forming a metal layer coupled to the fixing pin, wherein a bonding is to be performed on the metal layer.

2. The method of claim 1, wherein forming the contact hole comprises:
   forming a contact mask defining the contact hole over the second insulation layer;
   primarily etching the second insulation layer to a predetermined depth to form a first contact hole having a width greater than a width of the contact hole defined in the contact mask;
   forming a second contact hole by secondarily etching the second insulation layer under the first contact hole until the second insulation layer formed between the slits is removed; and
   forming a ball-shaped third contact hole by etching the first insulation layer formed under the second contact hole.

3. The method of claim 2, wherein the primary etching is performed by a wet etch process, and the secondary etching is performed by a dry etch process.

4. The method of claim 2, wherein the first contact hole is formed in a disk shape, the second contact hole is formed in a pillar shape, and the third contact hole is formed in a ball shape so that the diameter of the third contact hole is greater a size of an interval between the slits.

5. The method of claim 2, wherein forming the third contact hole is performed by an isotropic etch process.

6. The method of claim 1, wherein the fixing pin comprises a conductive layer.

7. The method of claim 1, wherein the fixing pin comprises a tungsten layer.

* * * * *